(12) United States Patent
Asuri et al.

(10) Patent No.: US 9,197,161 B2
(45) Date of Patent: Nov. 24, 2015

(54) DRIVING A MIXER WITH A DIFFERENTIAL LO SIGNAL HAVING AT LEAST THREE SIGNAL LEVELS

(75) Inventors: Bhushan S. Asuri, San Diego, CA (US); Hongyan Yan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 850 days.

(21) Appl. No.: 12/553,525

(22) Filed: Sep. 3, 2009

(65) Prior Publication Data

US 2011/0051838 A1 Mar. 3, 2011

(51) Int. Cl.
*H04L 25/34* (2006.01)
*H04L 25/49* (2006.01)
*H03D 7/18* (2006.01)
*H03K 4/02* (2006.01)

(52) U.S. Cl.
CPC .......... *H03D 7/18* (2013.01); *H03D 2200/0086* (2013.01); *H03K 4/026* (2013.01)

(58) Field of Classification Search
USPC ......................................................... 375/386
See application file for complete search history.

(56) References Cited

U.S. PATENT DOCUMENTS

| | | | |
|---|---|---|---|
| 3,649,922 A | 3/1972 | Ralph et al. | |
| 3,839,716 A | 10/1974 | Reichnebacher | |
| 4,458,216 A | 7/1984 | Bingham | |
| 4,713,622 A | 12/1987 | Wanchoo et al. | |
| 4,894,621 A | 1/1990 | Koenig et al. | |
| 7,224,219 B2 | 5/2007 | Spencer | |
| 7,738,851 B2 | 6/2010 | Cooley et al. | |
| 7,986,192 B2 | 7/2011 | Lee et al. | |
| 2004/0212417 A1* | 10/2004 | Behzad | 327/363 |
| 2008/0076375 A1 | 3/2008 | Cooley et al. | |
| 2009/0202022 A1* | 8/2009 | Kaczman et al. | 375/319 |
| 2009/0225741 A1* | 9/2009 | Wang et al. | 370/345 |
| 2009/0325510 A1* | 12/2009 | Pullela et al. | 455/76 |
| 2010/0119022 A1* | 5/2010 | He et al. | 375/350 |
| 2010/0120377 A1* | 5/2010 | He | 455/77 |
| 2011/0102051 A1 | 5/2011 | Zeller | |
| 2011/0298521 A1 | 12/2011 | Ru et al. | |
| 2012/0313672 A1* | 12/2012 | Andersson et al. | 327/116 |

(Continued)

FOREIGN PATENT DOCUMENTS

CN 101136647 A 3/2008
EP 2360835 A1 8/2011

(Continued)

OTHER PUBLICATIONS

Weldon et al., A 1.75GHz Highly-Integrated Narrow-Band CMOS Transmitter with Harmonic-Rejection Mixers, ISSCC 2001.*

(Continued)

Primary Examiner — Tanmay Shah
(74) Attorney, Agent, or Firm — Ramin Mobarhan

(57) ABSTRACT

The mixer of a transmit chain of a wireless transmitter (such as the transmitter of a cellular telephone handset) is driven with low third harmonic in-phase (I) and quadrature (Q) signals. The low third harmonic I and Q signals have three or more signal levels, and transition between the these three or more signal levels at times such that each of the I and Q signals approximates a sine wave and has minimal third harmonic spectral components. In one example, reducing the third harmonic components of the I and Q signals simplifies design of amplifier stages of the transmitter and helps reduce receive band noise.

22 Claims, 11 Drawing Sheets

(56) References Cited

U.S. PATENT DOCUMENTS

2014/0176217 A1 6/2014 Lin et al.
2015/0094004 A1 4/2015 Vora et al.

FOREIGN PATENT DOCUMENTS

| GB | 1341969 A | 12/1973 |
|---|---|---|
| GB | 2247792 A | 3/1992 |
| JP | S5863256 A | 4/1983 |
| JP | 2000183764 A | 6/2000 |
| JP | 2005341240 A | 12/2005 |
| JP | 2006519507 A | 8/2006 |
| WO | 2004017547 A2 | 2/2004 |
| WO | 2008139390 A1 | 11/2008 |
| WO | WO2008135954 A2 | 11/2008 |
| WO | 2009014535 A1 | 1/2009 |
| WO | 2011101305 A1 | 8/2011 |

OTHER PUBLICATIONS

International Preliminary Report on Patentability—PCT/US2010/047873, The International Bureau of WIPO—Geneva, Switzerland, Feb. 16, 2011.

Weldon, et al. "A 1.75 GHz Highly-Integrated Narrow-Band CMOS Transmitter with Harmonic-Rejection Mixers", 2001 IEEE International Solid-State Circuits Conference / ISSCC 2001 / Session 10 / Wireless Building Blocks I / 10.4, University of California, Berkeley, CA.

Moseley, et al., "Experimental Verification of a Harmonic-Rejection Mixing Concept using Blind Interference Canceling," European Conference on Wireless Technofory (EuwiT), Oct. 2008, pp. 210-213, Amsterdam, The Netherlands.

Weldon J.A., at al., A 1.75GHz Highly Integrated Narrow-Band CMOS Transmitter with Harmonic-Rejection Mixers, ISSCC 2001 IEEE International Solid-State Circuits Conference.

Klumperink Eric A.M., et a., "Cognitive radios for dynamic spectrum access polyphase multipath radio circuits for dynamic spectrum access", IEEE Communications Magazine, IEEE Service Center, Piscataway, US, vol. 44, No. 5, May 1, 2007, pp. 104-112, XP011181064, ISSN: 0163-6804 p. 109, col. 1, line 16-col. 2, line 19; figure 4.

Moseley N A et al., "A Two-Stage Approach to Harmonic Rejection Mixing Using Blind Interference Cancellation", IEEE Transactions on Circuits and Systems II: Express Briefs, IEEE, US, vol. 55, No. 10, Oct. 1, 2008, pp. 966-970, XP011236580, ISSN: 1549-7747, DOI: 10.1109/TCSII.2008.926796.

\* cited by examiner

THREE-STATE LOW THIRD HARMONIC I AND Q SIGNALS
(AS OUTPUT FROM LTHD)

LOGIC GATES

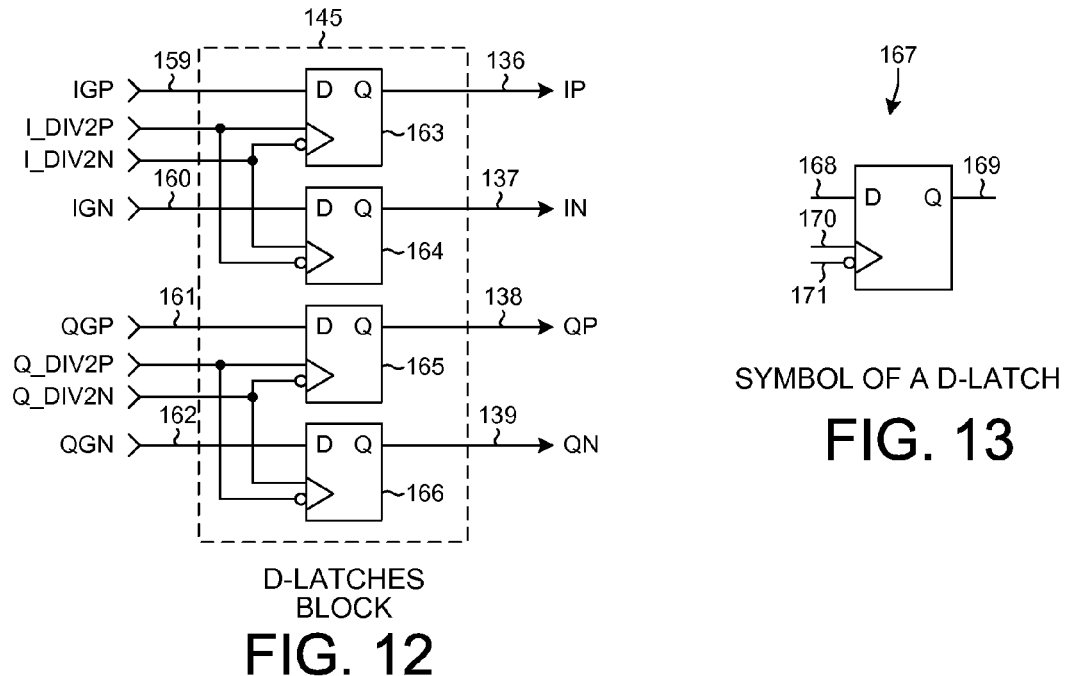
FIG. 12 — D-LATCHES BLOCK
FIG. 13 — SYMBOL OF A D-LATCH
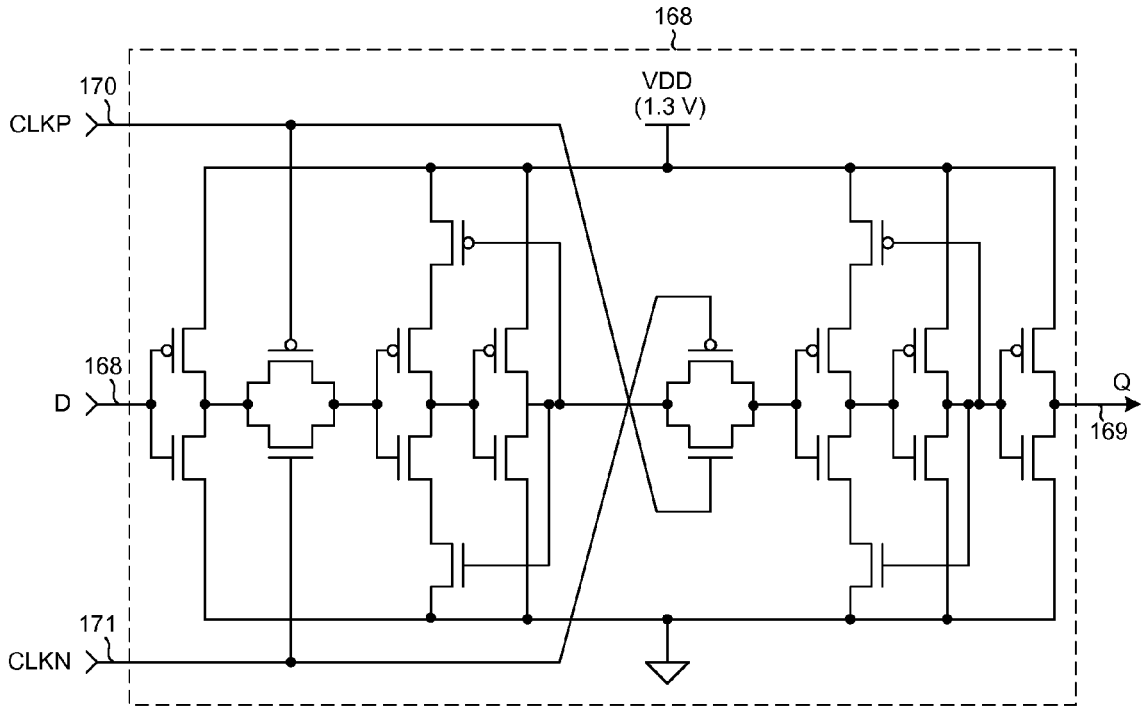
CIRCUIT DIAGRAM OF A D-LATCH
FIG. 14

GENERATION OF IGP, IGN, QGP AND QGN SIGNALS

OPERATION OF THE RETIMING CIRCUIT

FREQUENCY COMPONENTS OF CONVENTIONAL I AND Q SIGNALS

FREQUENCY COMPONENTS OF THE THREE-STATE LOW
THIRD HARMONIC I AND Q SIGNALS (OUTPUT BY LTHD 128 OF FIG. 8)

DRIVING A MIXER WITH A DIFFERENTIAL LO SIGNAL HAVING AT LEAST THREE SIGNAL LEVELS

BACKGROUND INFORMATION

1. Technical Field

The disclosed embodiments relate to driving a mixer, and more particularly to diving a mixer in the transmit chain of a wireless transmitter.

2. Background Information

In many radio transmitters, such as radio transmitters of cellular telephone handsets, information to be communicated is modulated onto a carrier for transmission. There are many complex modulation schemes that can be employed, but most of these schemes as currently practiced in cellular telephones can be categorized as involving one of two general approaches. In a first approach, a Voltage Controlled Oscillator (VCO) outputs a high frequency signal. The high frequency signal is then amplified and transmitted from an antenna. The VCO is directly modulated with intelligence information. A Digital-to-Analog Converter (DAC) may be used to supply a control signal to the VCO such that the VCO output signal is modulated to include the intelligence information. This first approach has certain advantages and disadvantages. In a second approach, a VCO is used but this VCO is not directly modulated with intelligence information. Rather, a relatively stable and fixed-frequency VCO output signal is supplied to a mixer. In addition, a lower frequency signal that includes the modulation intelligence information is supplied to the mixer. The lower frequency signal (also referred to as a baseband signal) is typically generated using a DAC. The mixer multiplies the VCO output signal by the baseband modulation intelligence information signal, thereby generating a higher frequency signal at about the frequency of the LO signal that includes the intelligence information. This higher frequency signal is then amplified and is transmitted from an antenna. This second approach also has certain advantages and disadvantages.

FIG. 1 (Prior Art) is a simplified diagram of a circuit that employs the second approach. Local oscillator 1 includes a Phase-Locked Loop (PLL) (not shown) which in turn includes a VCO (not shown). Local oscillator 1 generates a signal referred to here as a Local Oscillator (LO) signal. This LO signal is essentially an output of the VCO. The LO signal is supplied to one input of a mixer 2. A digital intelligence signal 3 includes intelligence information to be communicated. Digital signal 3 is converted into analog form by a DAC 4 such that an analog intelligence baseband signal is generated. This analog signal is filtered by filter 5 and is supplied to a second input of mixer 2 as an intelligence baseband signal BB. Mixer 2 multiplies the intelligence baseband signal BB with the LO signal to upconvert the intelligence signal in frequency. The upconverted signal 6, that includes the intelligence information, is then amplified by a driver amplifier 7 and a power amplifier 8 and is transmitted from an antenna 9.

FIG. 2 (Prior Art) is a diagram that illustrates a problem associated with the circuit of FIG. 1. In the illustrated example, the LO signal is of frequency 1 GHz and the baseband intelligence signal BB is of frequency 100 KHz. Mixer 2 is not an ideal circuit component, but rather it exhibits non-ideal characteristics. The signal 6 output by mixer 2 actually includes a signal 10 at the frequency of the fundamental of LO signal (1 GHz), as well as signals 11 and 12. The signal 11 has a frequency of three times the fundamental frequency. The signal 12 has a frequency of five times the fundamental frequency. Signals 11 and 12 are two of the odd harmonics of the fundamental signal. Although only two of these harmonics are illustrated, in actuality there are additional higher order odd harmonics that are also generated. In addition to generating the signals 10-12 at the fundamental frequency and at the odd harmonic frequencies, mixer 2 also outputs an upconverted version 13 of the intelligence signal. In addition, if the frequency of this signal 13 is the fundamental frequency plus the frequency of the baseband signal (1 GHz plus 100 KHz), then mixer 2 will also output versions 14 and 15 of the intelligence signal. Version 14 is located at a frequency of the third harmonic minus the frequency of the intelligence signal. In the example of FIG. 2, this frequency is 3 GHz minus 100 KHz. The mixer 2 also outputs version 15 of the intelligence signal at a frequency of the fifth harmonic plus the frequency of the intelligence signal. In the example of FIG. 2, this frequency is 5 GHz plus 100 KHz. In this pattern, the mixer outputs multiple versions of the intelligence signal, where the versions alternate in frequency positions above and below the odd harmonics of the fundamental, as the spectral components of the mixer are considered going up in frequency. The frequency components of signal 6 are illustrated in the left portion of FIG. 2.

Then, in addition to mixing, the practical circuit of FIG. 1 involves amplification of the mixer output signal 6. Practical amplifiers are non-linear to some extent. Non-linearity in the amplification stages 7 and 8 gives rise to intermixing of the various frequency components of signal 6. As a result of this intermixing, a version of the signal 14 will be folded down in frequency and will appear in the amplifier output as signal 16. The right portion of FIG. 2 illustrates the result of intermixing and the generation of signal 16. As illustrated, the frequency of signal 16 is close to the fundamental frequency of the LO.

FIG. 3 is a diagram that illustrates the right portion of FIG. 2 in further detail. In order to maximize the network capacity for cellular telephone protocols, there are often stringent requirements on how much energy a transmitter can transmit in and around an allotted band. In the example set forth here, the allotted band 17 extends from 1 GHz minus 100 KHz to 1 GHz plus 100 KHz. The folded down signal 16 appears slightly outside this band at a frequency of 1 GHz plus three times 100 KHz. In addition, there are requirements that define the maximum amount of power that the transmitter can transmit at each frequency extending away from allotted band 17 with increasing frequency, and extending away from allotted band 17 with decreasing frequency. Lines 18 and 19 identify these limits on transmit power and are referred to as a transmit mask. Care should be taken to ensure that folded down signal 16 is not of such a large magnitude that it violates the transmit mask.

Several techniques can be employed to ensure that signal 16 does not violate transmit mask requirements. For example, very large amplifiers can be used to realize the driver amplifier 7 and power amplifier 8 stages. Generally, the non-linearity of an amplifier increases as the amplifier is driven harder. If a small amplifier is driven harder to generate more gain such that an output signal of a desired power is generated, then the smaller amplifier will typically exhibit more non-linearity. If, however, a relatively large amplifier is provided to generate the output signal of the desired power, then the amplifier can generally be made to exhibit less non-linearity. Providing such a large amplifier is, however, expensive and/or consumes an undesirably large amount of power.

Rather than oversizing the amplifier in this way, another technique involves making an amplifier that does not output third harmonic components. Such an amplifier can be made using multiple stages, where each stage includes an amplifier that is not overdriven. Each stage therefore can be made to exhibit minimal non-linearity. The signal output from a stage is filtered to eliminate third harmonic components before the filtered signal is supplied to the input of the next amplification stage. Unfortunately this multi-stage technique can introduce an undesirable amount of noise into the amplified signal. In some cellular telephone standards, not only is it prohibited for the transmitter to inject too much power into the region of the allotted band of an adjacent device, but also the transmitter is prohibited from introducing too much noise into a receive band. This receive band is identified by "RX" in FIG. 3. Generally each amplifier stage adds an amount of noise. The accumulation of noise from the many amplifier stages may be so great that receive band noise requirements are violated.

Solutions to these problems are sought.

SUMMARY

The mixer of a transmit chain of a wireless transmitter (such as the transmitter of a cellular telephone handset) is driven with signals referred to here as "low third harmonic in-phase (I) and quadrature (Q) signals." Each of the low third harmonic I and Q signals has three or more signal levels. Transitions between these three or more signal levels occur at times such that the signal approximates a sine wave and has minimal third harmonic spectral components. In one specific example, each of the I and Q signals is a differential signals that, in one period, has a first zero volt signal level for a first 8.33 percent of the period, then has a second +1.3 volt signal level for a second 33.33 percent of the period, then has the first zero volt signal level for a third 16.66 percent of the period, then has a third −1.3 volt signal level for a fourth 33.33 percent of the period, and then has the first zero voltage signal level for a fifth 8.33 percent of the period. This particular I and Q signal waveform has three signal levels (also referred to as three states). The low third harmonic I and Q signals are generated by a Low Third Harmonic Divider (LTHD) circuit. The LTHD circuit receives a signal output by the Phase-Locked Loop (PLL) of the local oscillator, generates the low third harmonic I and Q signals, and outputs the low third harmonic I and Q signals to the mixer.

In one example, reducing the third harmonic components of the I and Q signals as compared to driving the mixer with conventional differential I and Q signals having only two signal levels simplifies the design of the amplifier stages of the transmitter and helps reduce receive band noise. By reducing or eliminating third harmonic spectral components from the local oscillator I and Q signals, the output of the mixer in a GSM/EDGE (Global System for Mobile communications/Enhanced Data rates for GSM Evolution) transmitter can be amplified without violating a GSM transmit mask and while satisfying receive band noise requirements of GSM and EDGE.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 12 is a more detailed circuit diagram of the D-latches block 145 of FIG. 8.

FIG. 13 is a diagram of the symbol of one of the D-latches in the D-latches block 145 of FIG. 12.

FIG. 14 is a more detailed circuit diagram of one of the D-latches of the D-latches block 145 of FIG. 8.

DETAILED DESCRIPTION

Figure 4:
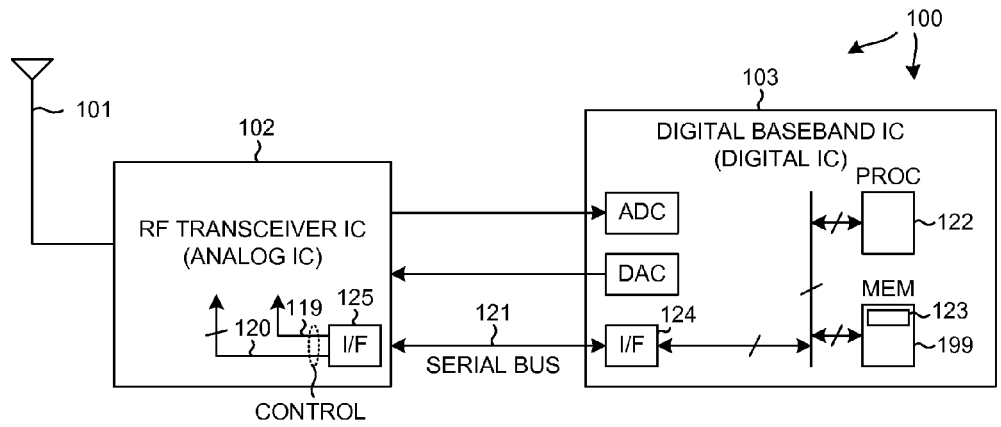
FIG. 4 is a diagram of a mobile communication device 100 in accordance with one novel aspect.

FIG. 4 is a very simplified high level block diagram of a mobile communication device 100 such as a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 5:
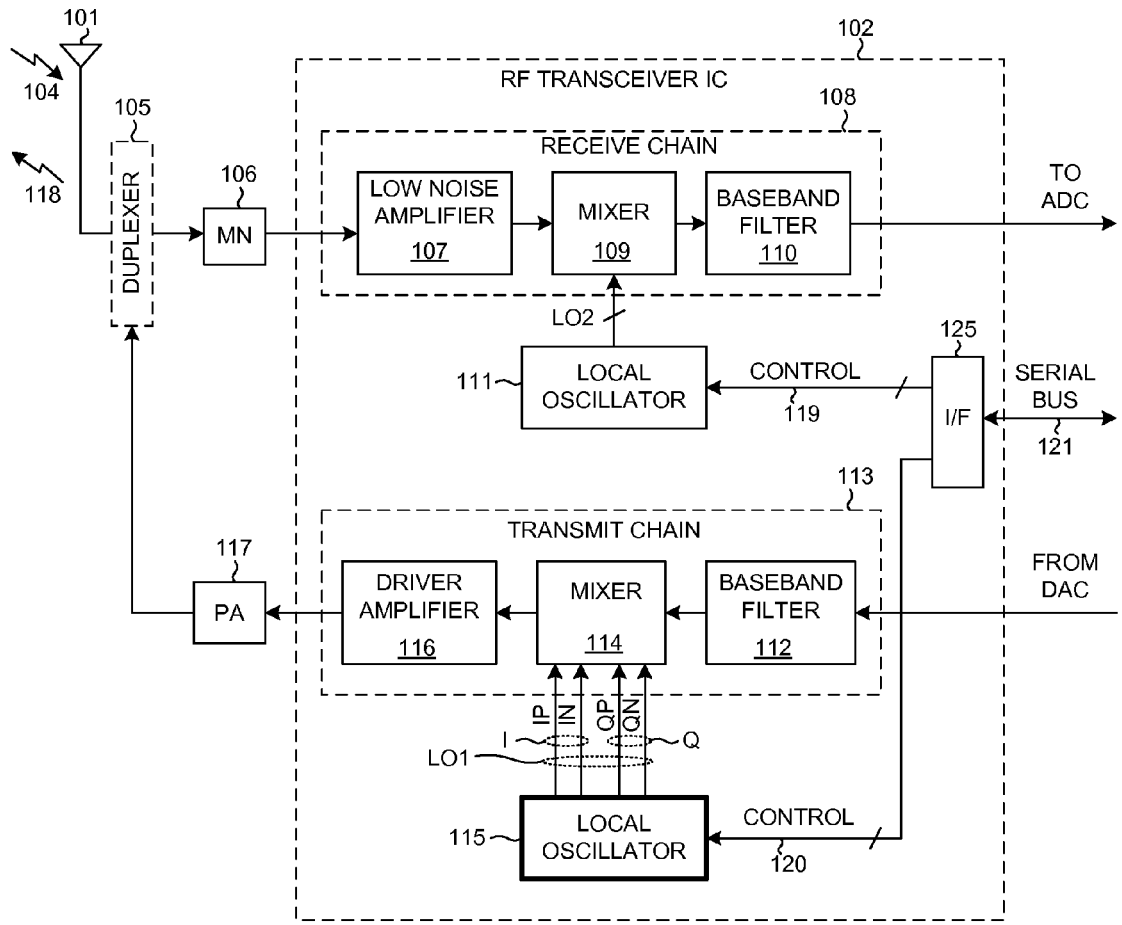
FIG. 5 is a more detailed diagram of the RF transceiver integrated circuit 102 of FIG. 4.

FIG. 5 is a more detailed diagram of the RF transceiver integrated circuit 102 of FIG. 4. In one very simplified explanation of the operation of the cellular telephone, if the cellular telephone is being used to receive audio information as part of a cellular telephone conversation, then an incoming transmission 104 is received on antenna 101. The signal passes through duplexer 105 and a matching network 106 and is amplified by a Low Noise Amplifier (LNA) 107 of a receive chain 108. After being downconverted in frequency by a mixer 109 and after being filtered by baseband filter 110, the information is communicated to the digital baseband integrated circuit 103 for analog-to-digital conversion and further processing in the digital domain. How the receive chain downconverts is controlled by changing the frequency of a local oscillator signal LO2 generated by local oscillator 111.

If, on the other hand, the cellular telephone 100 is being used to transmit audio information as part of a cellular telephone conversation, then the audio information to be transmitted is converted into analog form in digital baseband integrated circuit 103. The analog information is supplied to a baseband filter 112 of a transmit chain 113 of RF transceiver integrated circuit 102. After filtering, the signal is upconverted in frequency by mixer 114. The upconversion process is tuned and controlled by controlling the frequency of a local oscillator signal LO1 generated by local oscillator 115. Local oscillator signal LO1 includes two differential signals I and Q. The resulting upconverted signal is amplified by a driver amplifier 116 and an external power amplifier 117. The amplified signal is supplied to antenna 101 for transmission as outgoing transmission 118. The local oscillators 111 and 115 of the receive and transmit chains are controlled by control information CONTROL received via conductors 119 and 120 from digital baseband integrated circuit 103 by a serial bus 121. The control information CONTROL is generated by a processor 122 executing a set of processor-executable instructions 123. The instructions are stored in a processor-readable medium 199. The information passes through a bus interface 124, across serial bus 121, and through a second bus interface 125, and through conductors 119 and 120 to the local oscillators 111 and 115.

Figure 6:
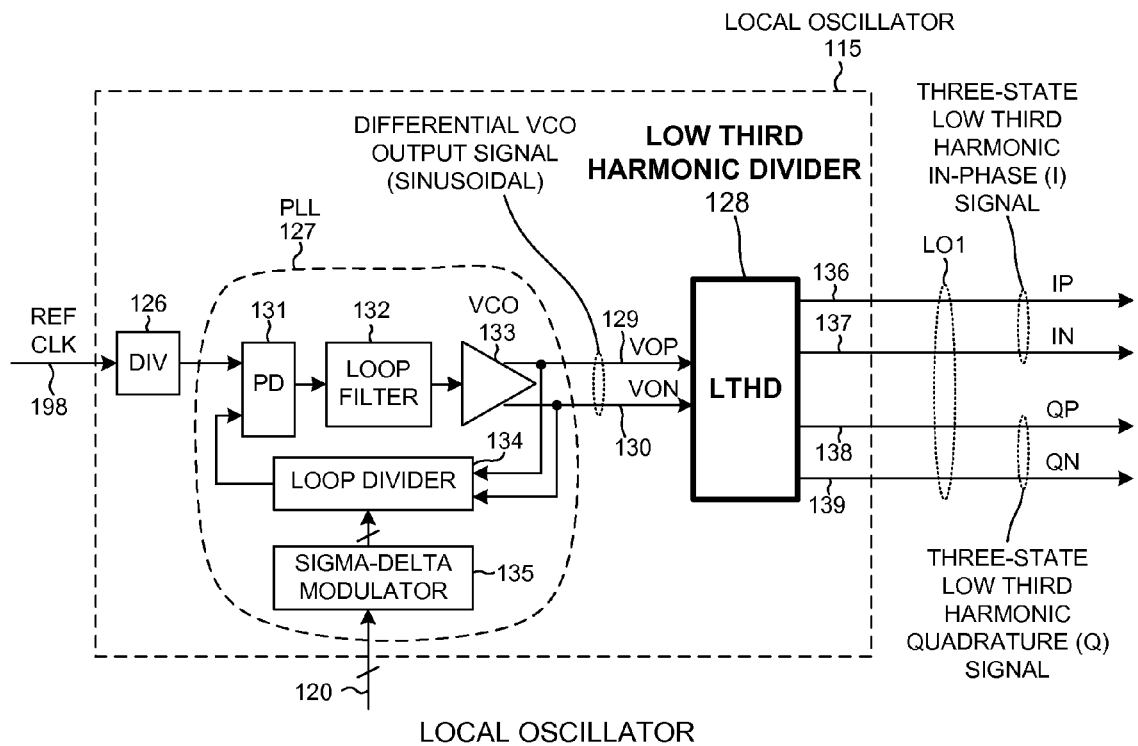
FIG. 6 is a more detailed diagram of the local oscillator 115 of the transmit chain of the RF transceiver integrated circuit 102 of FIG. 5.

FIG. 6 is a more detailed diagram of local oscillator 115 of FIG. 5. Local oscillator 115 includes a divider 126, a Phase-Locked Loop (PLL) 127, and a Low Third Harmonic Divider (LTHD) 128. Divider 126 receives an externally generated reference clock signal REF CLK (for example, generated by an external oscillator) on conductor 198 and generates a divided-down reference clock signal. PLL 127 receives the divided-down reference clock signal and the multi-bit digital control value on conductors 120, and generates therefrom a differential PLL output signal VO. The label "VO" used here indicates that the VO signal is the VCO output signal. The signal VO includes a signal VOP on conductor 129 and a signal VON on conductor 130. The signal VO is of a desired frequency as determined by the multi-bit control word on conductors 120. PLL 127 in this case includes a phase detector 131, a loop filter 132, a Voltage Controlled Oscillator (VCO) 133, a loop divider 134, and a Sigma-Delta Modulator 135. The VO signal output by VCO 133 is divided down in frequency by LTHD circuit 128 and is used to generate local oscillator signal L01. As explained above, local oscillator signal LO1 includes two differential output signals I and Q and is supplied to the mixer 114 of the transmitter. Differential output signal I involves signal IP on conductor 136 and signal IN on conductor 137. Differential output signal Q involves signal QP on conductor 138 and signal QN on conductor 139. Each of the I and Q signals is a three-state low third harmonic differential signal.

Figure 7:
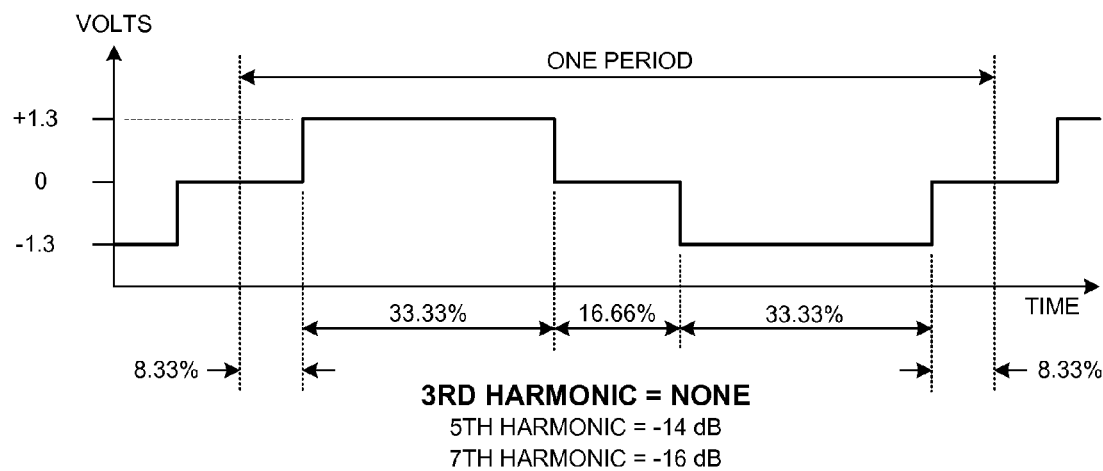
FIG. 7 is a waveform diagram of three-state low third harmonic I and Q signals output by the local oscillator 115 of FIG. 6. The diagram is a simplification of the waveform of a real signal. The waveform of a real signal would not have perfectly vertical signal edges and would not have perfectly square corners.

FIG. 7 is a simplified waveform diagram of the I and Q signals output by LTHD 128. The voltage in vertical axis of the diagram represents the differential voltage between conductors 136 and 137 in the case of the I signal or between conductors 138 and 139 in the case of the Q signal. Although the waveform is a voltage waveform in the particular example, in other examples the waveform may be a current waveform. In the illustrated example, the frequency of the fundamental is approximately one gigahertz. For the first 8.33 percent of a period the signal is at the zero volt signal level, for the next 33.33 percent of the period the signal is at the +1.3 volt signal level, for the next 16.66 percent of the period the signal is at the zero volt signal level, for the next 33.33 percent of the period the signal is at the −1.3 volt signal level, and for the last 8.33 percent of the period the signal is at the zero volt signal level. Due to the shape of this signal waveform, there is substantially no third harmonic component. The power of the fifth harmonic component of the signal is −14 dB with respect to the power of the fundamental. The power of the seventh harmonic component of the signal is −16 dB with respect to the power of the fundamental.

Figure 8:
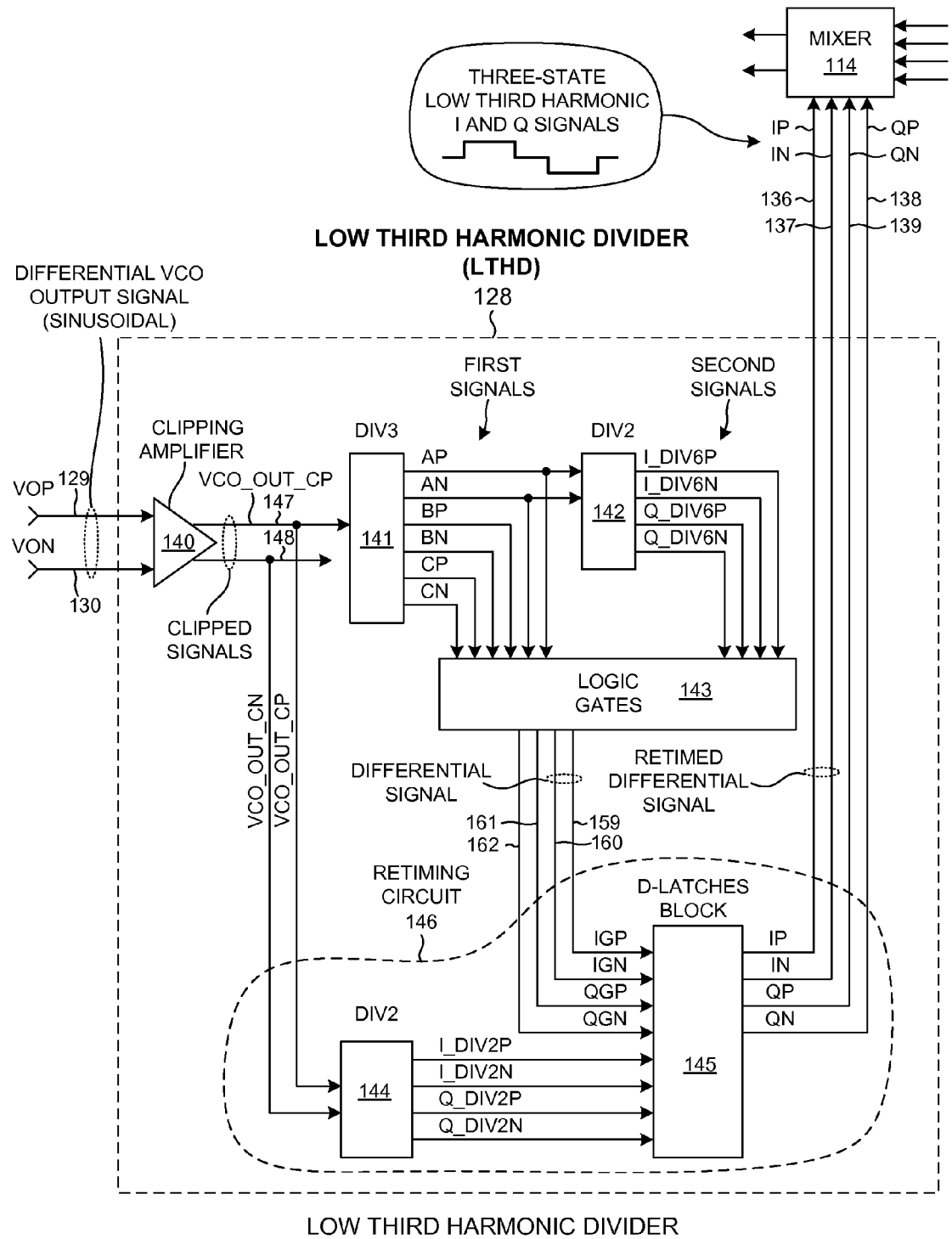
FIG. 8 is a more detailed diagram of the Low Third Harmonic Divider (LTHD) circuit 128 within the local oscillator 115 of FIG. 6.

FIG. 8 is a more detailed circuit diagram of the Low Third Harmonic Divider (LTHD) 128 of FIG. 7. LTHD 128 receives the differential VCO output signal VO on conductors 129 and 130 from the VCO 133 of FIG. 6. LTHD 128 outputs the three-state low third harmonic I signal on conductors 136 and 137 to mixer 114. LTHD 128 also outputs the three-state low third harmonic Q signal on conductors 138 and 139 to mixer 114. LTHD 128 includes a clipping amplifier 140, a first divider 141 that divides by three, a second divider 142 that divides by two, a block of logic gates 143, a divider 144 that divides by two, and a D-latches block 145. Divider 144 and D-latches 145 together form a retiming circuit 146.

The differential VCO output signal VO received on conductors 129 and 130 in this case is a sinusoidal differential signal. Clipping amplifier 140 receives this sinusoidal differential signal and amplifies it such that the output of amplifier 140 is a clipped version of the differential VCO output signal. This clipped signal involves signal VCO_OUT_CP on conductor 147 as well as signal VCO_OUT_CN on conductor 148.

Figure 9:
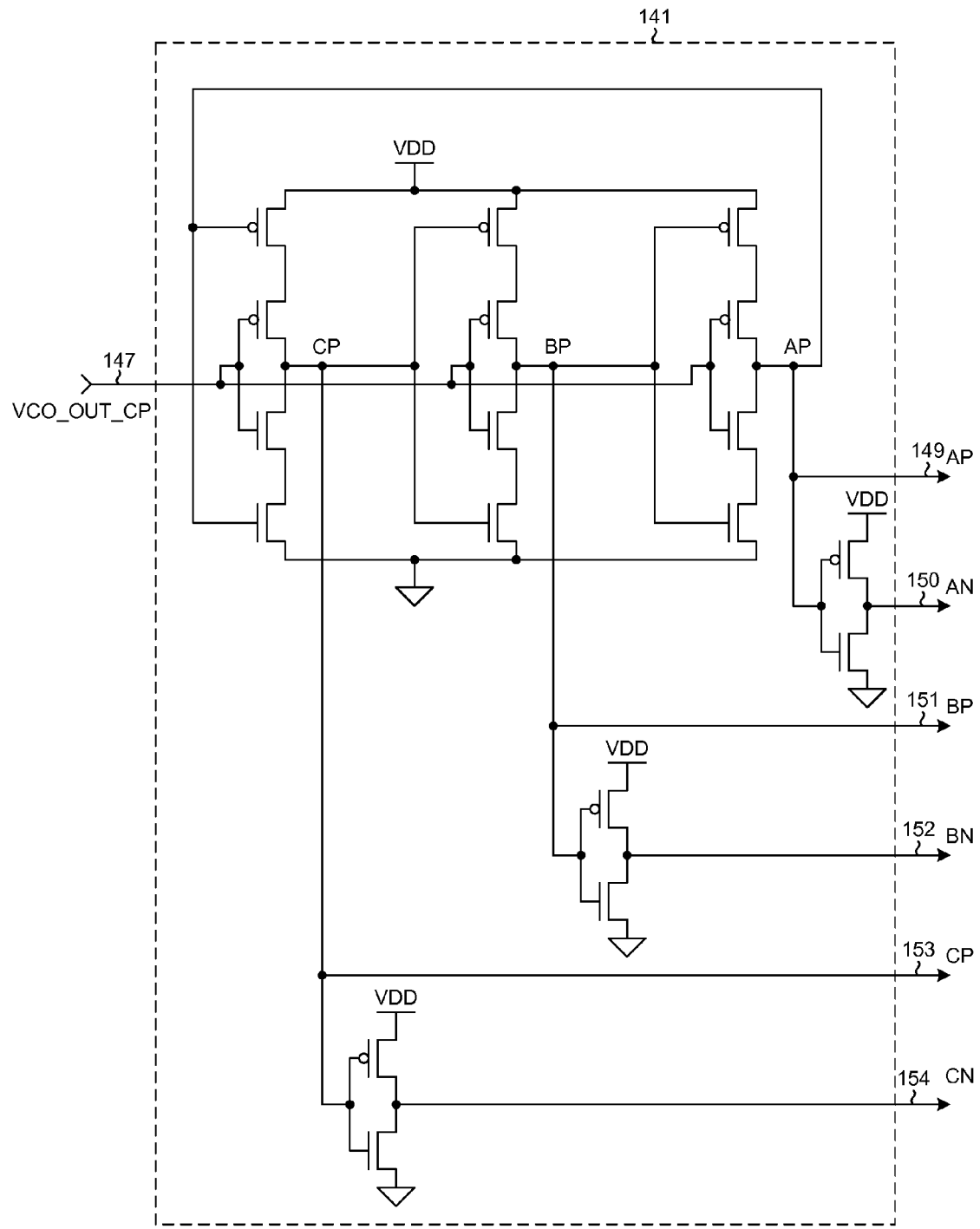
FIG. 9 is a more detailed circuit diagram of divider 141 of FIG. 8.

FIG. 9 is a more detailed diagram of divider 141 of FIG. 8. The circuit receives signal VCO_OUT_CP on conductor 147 and outputs three differential signals. The first differential signal involves signal AP on conductor 149 and signal AN on conductor 150. The second differential signal involves signal BP on conductor 151 and signal BN on conductor 152. The third differential signal involves signal CP on conductor 153 and signal CN on conductor 154.

Figure 10:
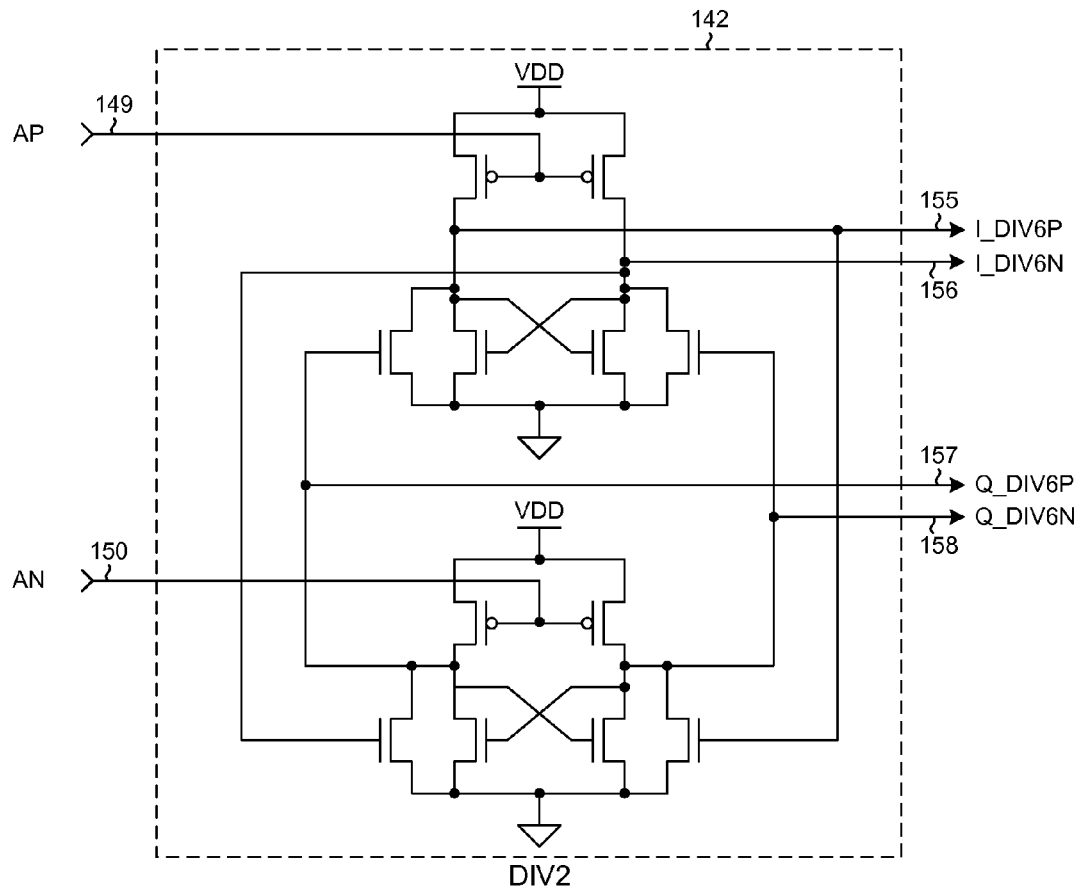
FIG. 10 is a more detailed circuit diagram of divider 142 of FIG. 8.

FIG. 10 is a more detailed diagram of divider 142 if FIG. 8. The circuit receives differential signal A involving signal AP on conductor 149 and signal AN on conductor 150. The circuit outputs two differential signals. The first differential signal involves signal I_DIV6P on conductor 155 and signal I_DIV6N on conductor 156. The second differential signal involves signal Q_DIV6P on conductor 157 and signal Q_DIV6N on conductor 158. The circuitry of divider 144 of FIG. 8 is of identical construction to the circuitry of divider 142. The differential signal input for divider 144 is, however, the clipped differential signal VCO_OUT_C involving signal VCO_OUT_CP on conductor 147 and signal VCO_OUT_CN on conductor 148 as illustrated in FIG. 8. The signal names of the signals output by divider 142 involve the "DIV6" notation because these signals are generated by dividing the VCO_OUT_CP signal by six. The divider 141 divides by three, and the output of the divider 141 is divided by two using divider 142. The signals output from divider 142 are therefore the signal VCO_OUT_CP divided by six. The "Q" differential signal involving Q_DIV6P and Q_DIV6N is ninety degree out of phase with respect to the "I" differential signal involving I_DIV6P and I_DIV6N. Similarly, the "Q"

signal involving Q_DIV2P and Q_DIV2N is ninety degrees out of phase with respect to the "I" signal involving I_DIV2P and I_DIV2N.

Figure 11:
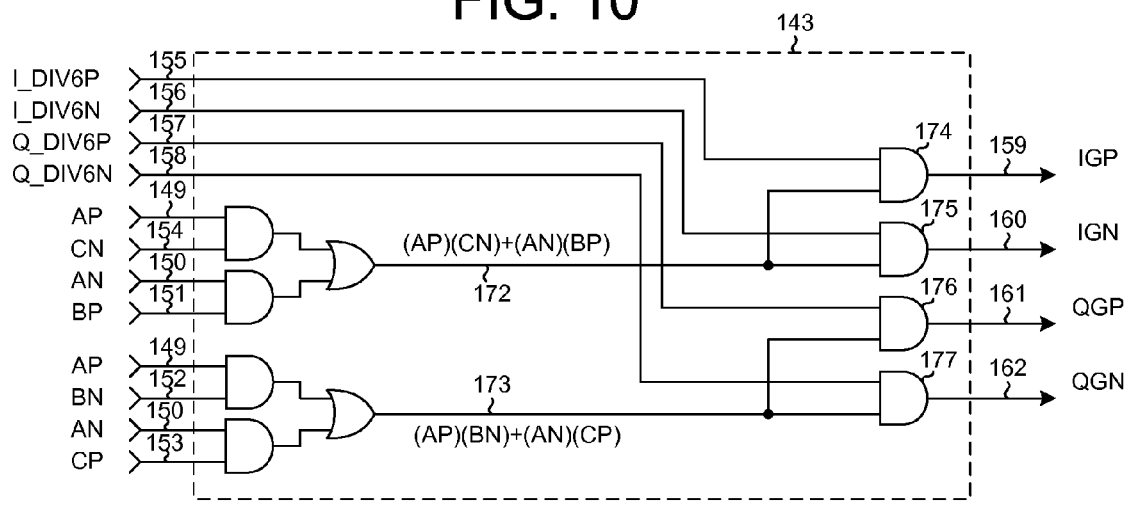
FIG. 11 is a more detailed circuit diagram of the logic gates block 143 of FIG. 8.

FIG. 11 is a more detailed diagram of the logic gates block 143 of FIG. 8. The gates depicted are single-ended logic gates. The logic gates block 143 outputs signal IGP on conductor 159, outputs signal IGN on conductor 160, outputs signal QGP on conductor 161, and outputs signal QGN on conductor 162.

FIG. 12 is a more detailed diagram of D-latches block 145. D-latches block 145 includes four differential input D-latches 163-166 interconnected as illustrated. The D-latches block 145 outputs the I and Q signals to mixer 114 via conductors 136-139 as illustrated in FIG. 8. Although the specific example of the retiming circuit described here includes a D-latches block of latches, the D-latches block may include flip-flops rather than D-latches in other embodiments.

FIG. 13 is a symbol 167 of one of the differential input D-latches of FIG. 12. The D-latch receives a single-ended data (D) input signal on a data input lead 168 and outputs a single-ended data (Q) output signal on a data output lead 169. The latch is, however, clocked by a differential clock signal received on a corresponding pair of clock input leads 170 and 171.

FIG. 14 is a circuit diagram of the D-latch 167 of FIG. 13. Identical instances of this circuitry are used to realize the D-latches 163-166 of D-latches block 145 of FIG. 12.

Figure 15:
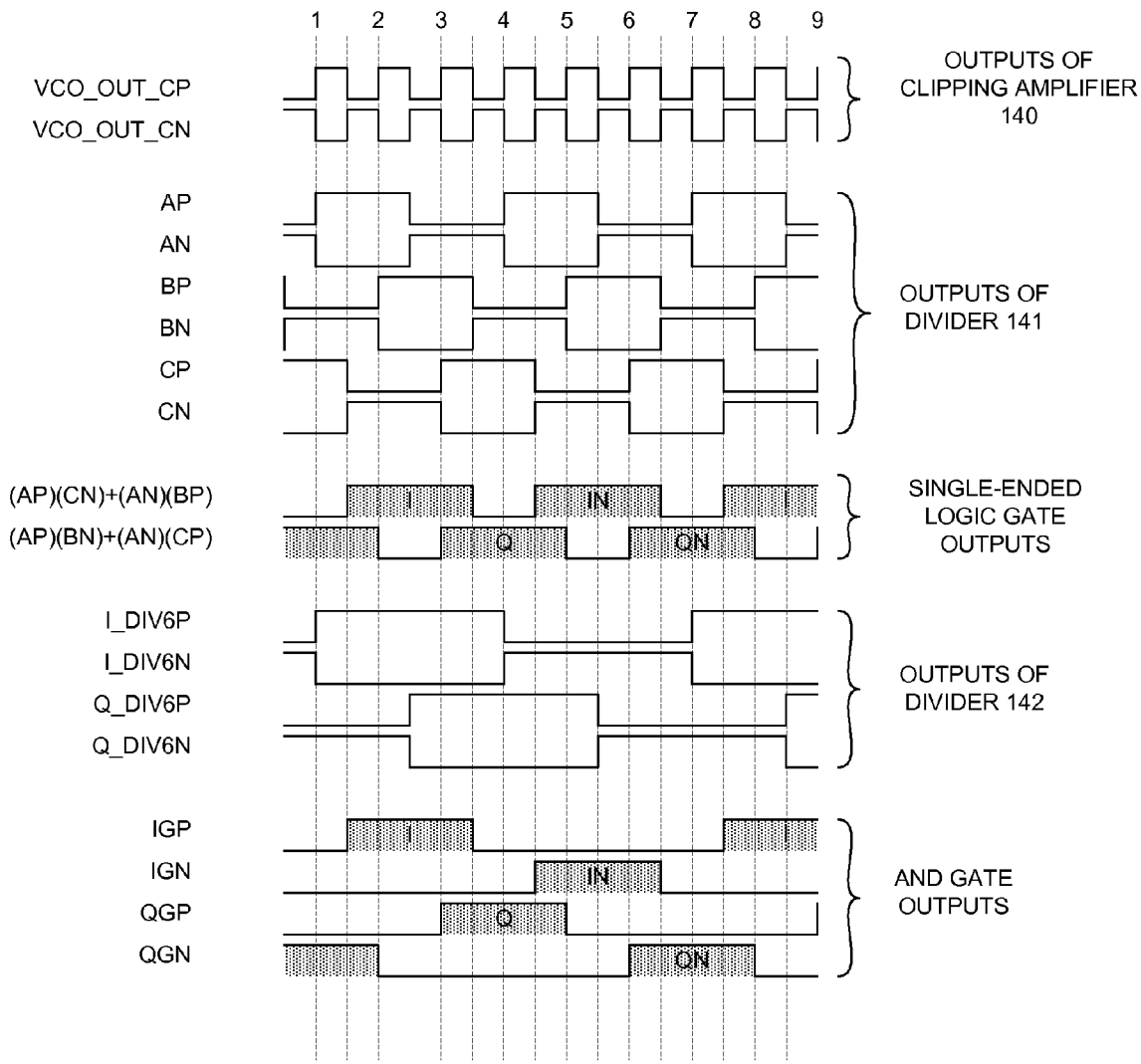
FIG. 15 is a waveform diagram that illustrates how the LTHD 128 of FIG. 8 operates to generate the signals IGP, IGN, QGP and QGN.

FIG. 15 is a waveform diagram that illustrates an operation of the LTHD 128 of FIG. 8. The waveform for signal (AP)(CN)+(AN)(BP) is the waveform of a signal on node 172 of the logic gates block 143 of FIG. 11. The waveform for signal (AP)(BN)+(AN)(CP) is the waveform of a signal on node 173 of the logic gates block 143 of FIG. 11. These signals are generated by combinatorially combining the AP, AN, BP, BN, CP and CN signals using logic gates. The waveforms labeled I_DIV6P, I_DIV6N, Q_DIV6P and Q_DIV6N are waveforms of the signals output by divider 142. The waveform of signal IGP includes a high pulse that is labeled "I" in FIG. 15. Note that this pulse corresponds to the pulse labeled "I" of the signal (AP)(CN)+(AN)(BP). The waveform of signal IGP does not, however, include any high pulse that corresponds to the pulse labeled "IN" of the signal (AP)(CN)+(AN)(BP). Also note that the signal I_DIV6P is at a digital high level throughout the "I" pulse of the signal (AP)(CN)+(AN)(BP), but is at a digital low level throughout the "IN" pulse of the signal (AP)(CN)+(AN)(BP). The signal IGP can therefore be generated by using the I_DIV6P signal as a selector signal to pass selectively the "I" pulse of signal (AP)(CN)+(AN)(BP) and to block selectively the "IN" pulse of (AP)(CN)+(AN)(BP). The selective passing and blocking of the pulses of the signal (AP)(CN)+(AN)(BP) is accomplished by logical ANDing of the (AN)(CN)+(AN)(BP) signal and the I_DIV6P signal. Note that AND gate 174 performs this logical AND function and outputs the signal IGP. In a similar fashion, AND gate 175 performs a logical AND function of the signals (AN)(CN)+(AN)(BP) and I_DIV6N and outputs the signal IGN. If the differential voltage between the signal IGP on conductor 159 of FIG. 15 and the signal IGN on conductor 160 of FIG. 15 were charted, the voltage would have the same general three signal level waveform as the waveform of FIG. 7.

In a similar fashion, AND gate 176 of FIG. 11 performs a logical AND function of the signals (AP)(BN)+(AN)(CP) and Q_DIV6P and outputs the signal QGP. In a similar fashion, AND gate 177 of FIG. 11 performs a logical AND function of the signals (AP)(BN)+(AN)(CP) and Q_DIV6N and outputs the signal QGN. If the differential voltage between the signal QGP on conductor 161 of FIG. 15 and the signal QGN on conductor 162 of FIG. 15 were charted, the voltage would have the same general three signal level waveform as the waveform of FIG. 7.

Due to delay through divider 142, the signals output divider 142 may switch at times that are slightly after the times when the signals output from divider 141 switch. The signals supplied as inputs to the logic gates block 143 therefore may transition at times that are not perfectly aligned with respect to edges of the VCO_OUT_CP and VCO_OUT_CN signals. In addition, there may be different propagations times through different signal paths through the logic gates block 143. For these reasons, the edges of the signals IGP, IGN, QGP and QGN as output from logic gates block 143 are not as time-aligned with respect to the edges of the VCO_OUT_CP and VCO_OUT_CN as desired.

Figure 16:
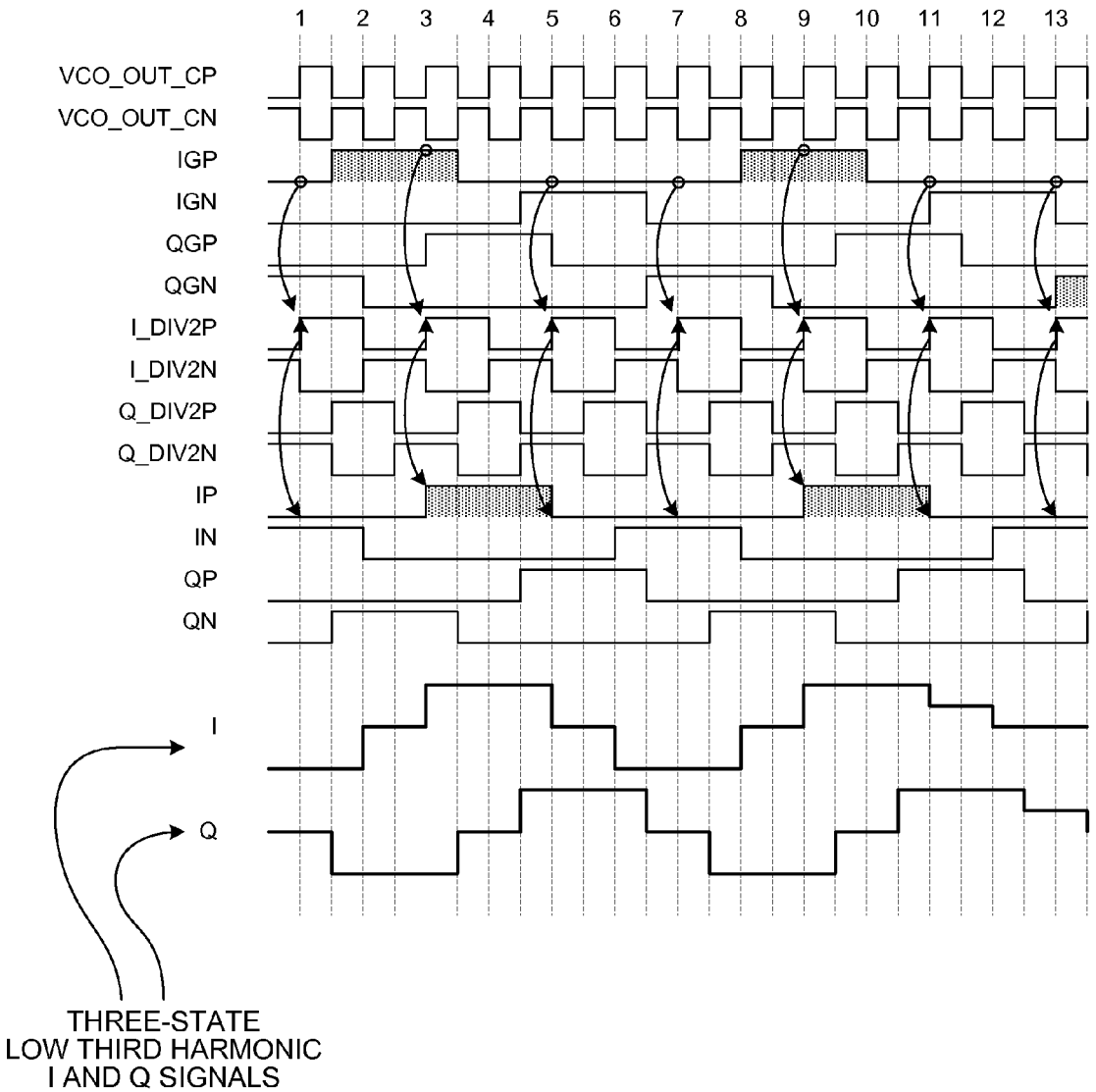
FIG. 16 is a waveform diagram that illustrates how the retiming circuit 146 of FIG. 8 operates to retime the signals IGP, IGN, QGP and QGN.

FIG. 16 is a waveform diagram that illustrates how retiming circuit 146 retimes these signal edges to improve the degree to which the switching of signals IP, IN, QP and QN occurs at the same times. The arrows in the waveform illustrate the operation of one D-latch in the D-latches block 145. This D-latch 163 is the latch in FIG. 12 that retimes the signal IGP and outputs the retimed signal IP. Divider 144 of FIG. 8 receives the VCO_OUT_CP and VCO_OUT_CN signals on conductors 147 and 148, divides by two, and outputs the signals I_DIV2P, I_DIV2N. The waveforms of two signals are illustrated in FIG. 16. These signals I_DIV2P and I_DIV2N are used to clock latch 163 so that latch 163 latches the value of the signal IGP on the rising edges of I_DIV2P (and falling edged of I_DIV2N). The signal output by latch 163 only changes at the times of rising edges of I_DIV2P. The signal IGP is therefore retimed. Note that the signal IP has the same general periodicity at the signal IGP, but it is delayed in time with respect to signal IGP by one and a half periods of the signal VCO_OUT_CP. The time from the rising edge of I_DIV2P to the time when the signal IP changes is, however, the delay through one D-latch. Because signals IGN, QGP and QGN are retimed using similar circuitry, the edges of the retimed signals IN, QP and QN also only transition within one D-latch delay of the edges of the I_DIV2P signal.

Figure 1:
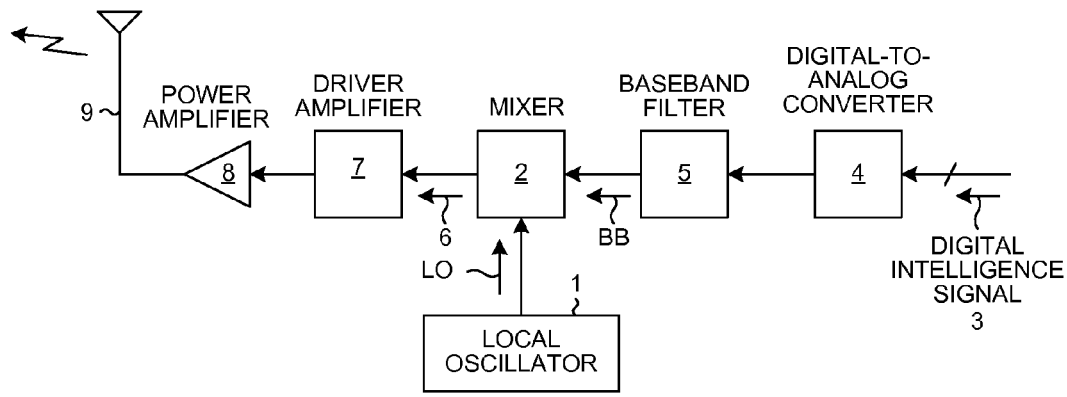
FIG. 1 (Prior Art) is a diagram of a wireless transmitter in which a local oscillator supplies a conventional local oscillator signal LO to a mixer.
Figure 2:
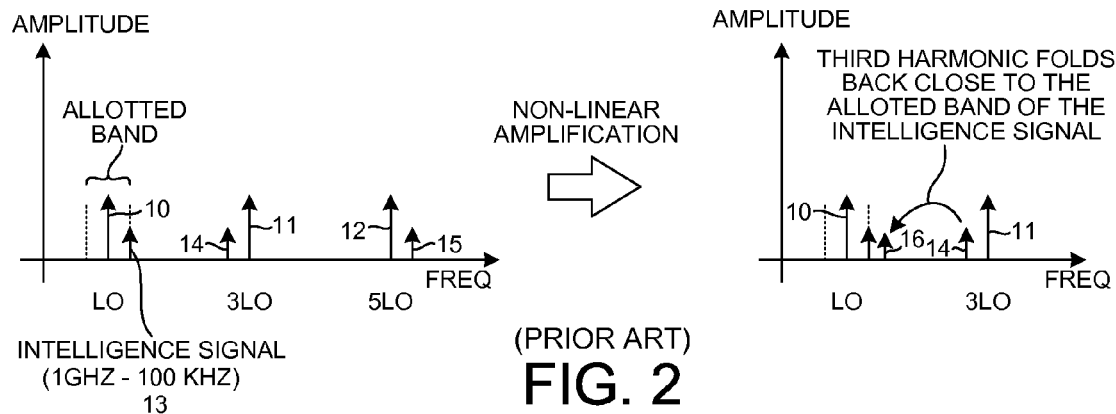
FIG. 2 (Prior Art) is a diagram that illustrates a problem caused by third harmonics in the LO signal of FIG. 1.
Figure 3:
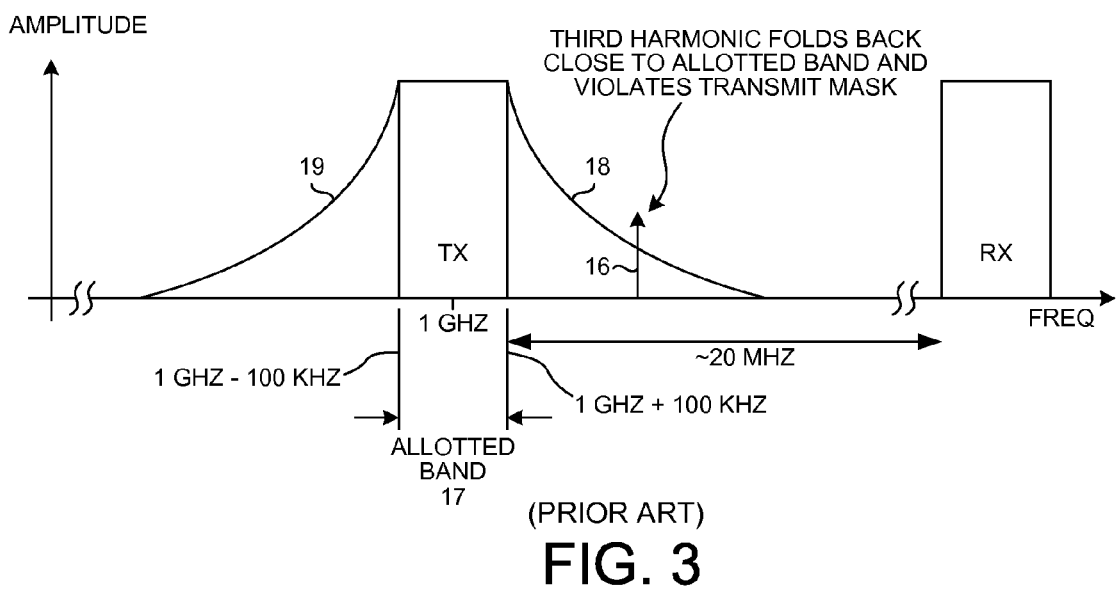
FIG. 3 (Prior Art) is a diagram that illustrates the problem of FIG. 2 in further detail.

The I signal waveform at the bottom of FIG. 16 represents the differential voltage present between conductors 136 and 137. The waveform has the desired three-state low third harmonic waveform of FIG. 7. Similarly, the Q signal waveform at the bottom of FIG. 16 represents the differential voltage present between conductors 138 and 139. The waveform has the desired three-state low third harmonic waveform of FIG. 7. These two three-signals level differential signals I and Q have substantially less third harmonic components than conventional differential I and Q signals that have only two signals levels. By reducing the third harmonic component of the LO1 signal supplied to mixer 114 in the transmit path of FIG. 5, the third harmonic fold back problem described above in connection with FIG. 2 is minimized or eliminated. There is no need to use careful multi-stage amplification with intervening third harmonic filtering in order to prevent the fold back problem, so the receive band noise problem discussed above in connection with FIG. 3 is also minimized or eliminated.

Figure 17:
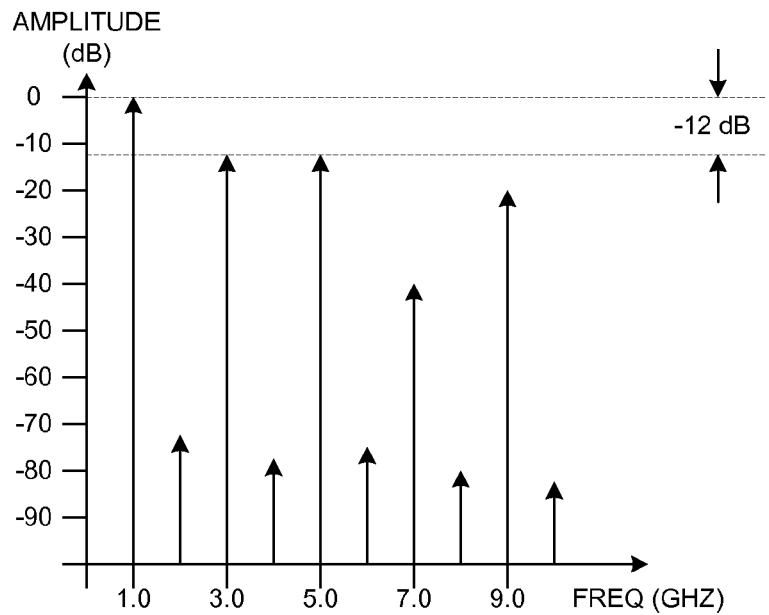
FIG. 17 is a chart that shows the spectral components of conventional I and Q LO signals.

FIG. 17 is a diagram that shows the spectral components of conventional I and Q signals having two signal levels. The magnitude of the third harmonic is approximately −12 dB with respect to the magnitude of the fundamental.

Figure 18:
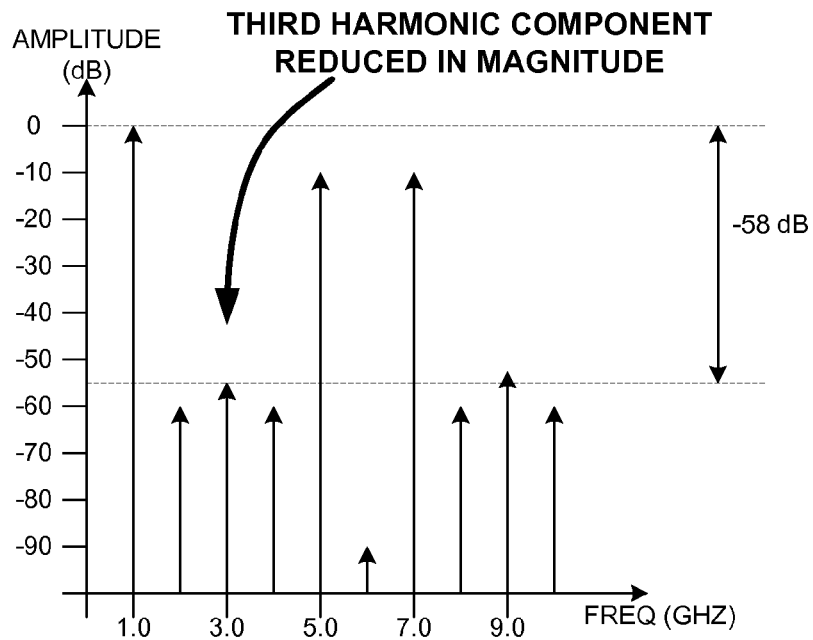
FIG. 18 is a chart that shows the spectral components of the three-state low third harmonic I and Q signals generated by the LTHD 128 of FIG. 8.

FIG. 18 is a diagram that shows the spectral components of the three-state low third harmonic I and Q signals generated by the LTHD circuit 128 of FIG. 8. The magnitude of the third harmonic is approximately −58 dB with respect to the magnitude of the fundamental. Whereas in FIG. 17 the power of the third harmonic is approximately ⅕ of the power of the fundamental, in FIG. 18 the power of the third harmonic is approximately ⅟30 of the power of the fundamental. In the embodiment described above of FIGS. 4-16, when the driver amplifier 116 is driving power into a fifty ohm load of power amplifier 117, the receive band noise from the transmitter is approximately −165 dBc/Hz. The strength of the folded down signal (fmod) due to a third harmonic component in the LO1 I and Q signals is approximately −63.5 dBc. If this fmod value (which takes into account non-linearity of the transmit chain except for the external power amplifier 117) is below −60 dBc, then the GSM transmit mask will generally not be violated if an ordinary commercially available external power amplifier is used for power amplifier 117.

Figure 19:
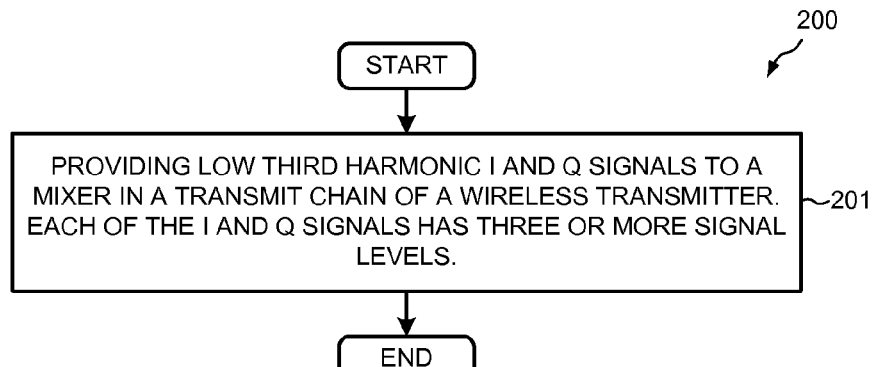
FIG. 19 is a simplified flowchart of a novel method 200.

FIG. 19 is a flowchart of a method 200. In the method, low third harmonic I and Q signals are provided (step 201) to a mixer in a transmit chain of a wireless transmitter. In one example of the method, the low third harmonic I and Q signal have the same three-state low third harmonic signal waveform illustrated in FIG. 7. The three signal levels are also referred to here as three "states". In this example of the method, the LTHD circuit 128 of FIG. 8 is used to generate the three-state low third harmonic I and Q signals, and the I and Q signals so generated are supplied to mixer 114 in the transmit chain 113 of the mobile communication device 100 of FIG. 4, where the mobile communication device 100 is a cellular telephone handset. In other examples of the method, the low third harmonic I and Q signals have more than three signal levels (more than three states). The timing of the transitioning from one signal level to the next as well as the relative magnitudes of the signal levels are determined to reduce the magnitude of third harmonic spectral components in the I and Q signals.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In one illustrative example, the set of processor-executable instructions 123 when executed by processor 122 causes processor 122 to send configuration information CONTROL via serial bus 121 to local oscillator 115. Bits of this information configure the LTHD circuit within the local oscillator. The magnitudes of the signal levels, the counters, and the logic gates of the LTHD circuit are configurable such that the magnitudes of signal levels, the number of signal levels, as well as the timing of transitions from one signal level to another are configurable. The LTHD is a configurable waveform synthesizer. Such a configurable LTHD circuit is configurable by digital baseband integrated circuit 103 so that digital baseband integrated circuit 103 can change the waveform of the LO1 signals supplied to mixer 114 in the transmit chain adaptively during cellular telephone operation. The waveform with which the mixer is driven can be changed depending on the cellular telephone protocol being employed.

Figure 20:
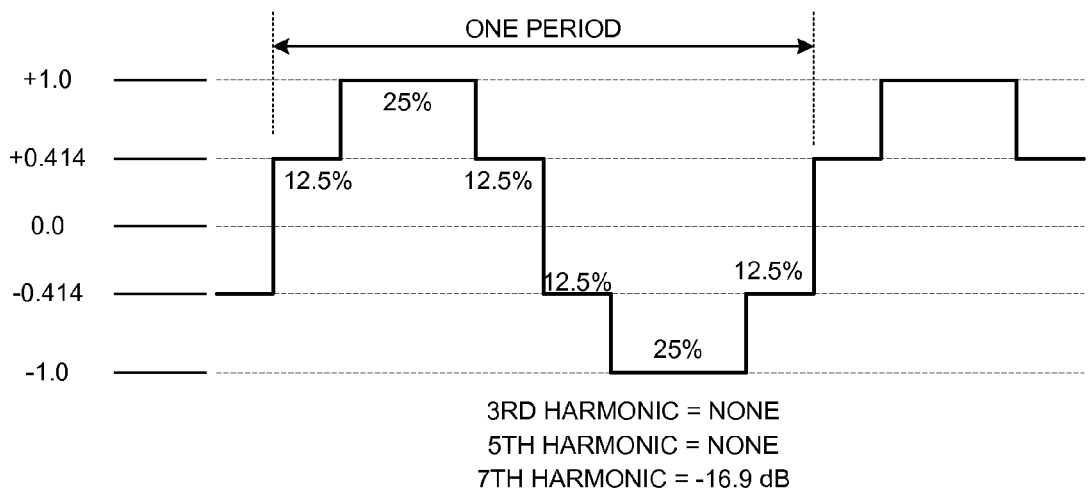
FIG. 20 is a waveform of another example of low third harmonic I and Q signals that can be generated by other embodiments of the LTHD described above. The waveform shown in FIG. 20 has four signal levels.

FIG. 20 is a waveform diagram of another I and Q signal waveform that the LTHD circuit of a local oscillator can be made to supply to the mixer in a transmit chain.

Figure 21:
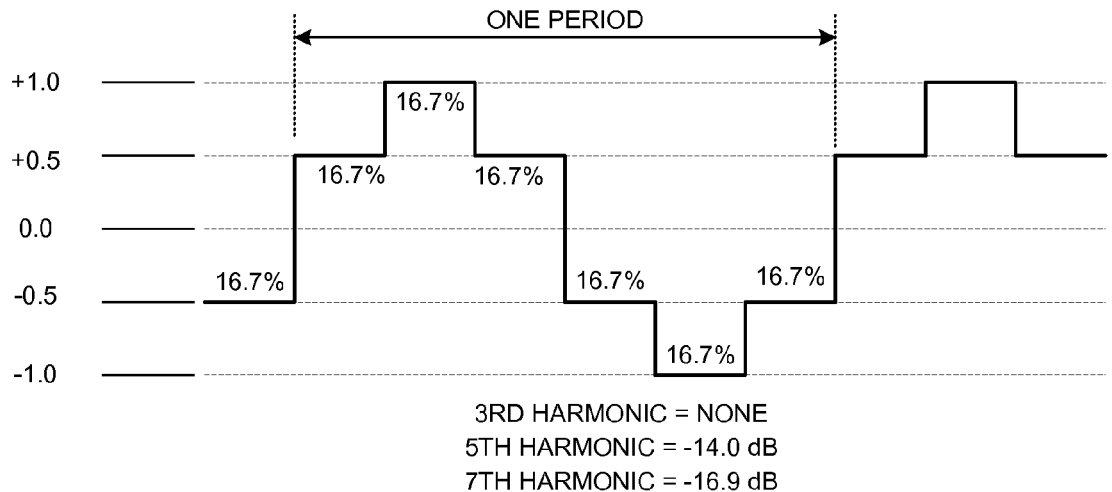
FIG. 21 is a waveform of another example of low third harmonic I and Q signals that can be generated by other embodiments of the LTHD described above. The waveform shown in FIG. 21 has four signal levels.

FIG. 21 is a waveform diagram of yet another I and Q signal waveform that the LTDH circuit of a local oscillator can be made to supply to the mixer in a transmit chain. The numbers that label the vertical scales in FIG. 20 and FIG. 21 are relative values. The "+1.0" value may, for example, represent 1.3 volts. In that case, the "−1.0" value would represent −1.3 volts.

Although certain specific embodiments are described above for instructional purposes, the teachings of this patent document have general applicability and are not limited to the specific embodiments described above. A low third harmonic signal need not be differential, but rather may be single-ended. A differential low third harmonic signal may involve more than three signal levels. Slew rate control can be employed to reduce the abruptness of transitions from one signal level to the next signal level. Rather than generating waveforms having minimized third harmonic components, the teachings of this patent document can be applied to generate waveforms that have minimized fifth or other harmonic components. Accordingly, various modifications, adaptations, and combinations of the various features of the described specific embodiments can be practiced without departing from the scope of the claims that are set forth below.

What is claimed is:

1. A method comprising:
    driving a mixer of a transmit chain within a wireless transmitter with a periodic signal, wherein a period of the periodic signal includes a first portion, a second portion and a third portion, wherein the periodic signal has a first signal level during the first portion, wherein the periodic signal has a second signal level during the second portion, and wherein the periodic signal has a third signal level during the third portion, and wherein the first and third portions are separated by part of the second portion having the second signal level different than the first and third signal levels, wherein the periodic signal is a periodic differential signal and the periodic differential signal has a waveform that represents a sine wave, wherein the sine wave has a fundamental frequency, and wherein the periodic differential signal has substantially no third harmonic component.

2. The method of claim 1, wherein the first, second and third signal levels are substantially constant voltages of different magnitudes.

3. The method of claim 1, wherein the first signal level is a positive voltage, wherein the second signal level is a voltage of substantially zero volts, and wherein the third signal level is a negative voltage.

4. The method of claim 1, wherein the period of the periodic signal has a fourth portion, and wherein the periodic signal has a fourth signal level during the fourth portion.

5. The method of claim 1, wherein the periodic signal has substantially no third harmonic frequency component.

6. The method of claim 1, wherein the first, second and third signal levels are currents of different magnitudes.

7. The method of claim 1, wherein the first signal level is a positive current, wherein the second signal level is a current of substantially zero amperes, and wherein the third signal level is a negative current.

8. The method of claim 1, further comprising:
receiving a Phase-Locked Loop (PLL) output signal; and
using the PLL output signal to generate the periodic signal.

9. The method of claim 1, wherein the periodic differential signal is a first periodic differential signal, and wherein the first periodic differential signal is generated by frequency dividing a periodic signal by a first value and thereby generating first signals, frequency dividing the periodic signal by a second value and thereby generating second signals, supplying the first and second signals to a plurality of logic gates so that the logic gates output a second differential periodic signal, and supplying the second periodic differential signal to a retiming circuit such that the retiming circuit outputs the first periodic differential signal.

10. A method comprising:
driving a mixer of a transmit chain within a wireless transmitter with a periodic signal, wherein a period of the periodic signal includes a first portion, a second portion and a third portion, wherein the periodic signal has a first signal level during the first portion, wherein the periodic signal has a second signal level during the second portion, and wherein the periodic signal has a third signal level during the third portion, and wherein the first and third portions are separated by part of the second portion having the second signal level different than the first and third signal levels, wherein the periodic signal is a periodic differential signal and the periodic differential signal is a first periodic differential signal, the method further comprising:
driving the mixer with a second periodic differential signal, wherein the first and second differential periodic signals have substantially identical waveforms except that the second periodic differential signal is offset in phase by approximately ninety degrees with respect to the first periodic differential signal.

11. The method of claim 1, wherein the sine wave has a fundamental frequency, and wherein the periodic differential signal has substantially no fifth harmonic component.

12. The method of claim 1, wherein the wireless transmitter transmits signals in accordance with one of a Global System for Mobile (GSM) communications standard and an Enhanced Data rates for GSM Evolution (EDGE) communication standard.

13. A circuit, comprising:
a mixer; and
a signal generator that supplies a periodic signal to the mixer, wherein the periodic signal includes a period, wherein the period includes a first portion, a second portion and a third portion, wherein the periodic signal has a first signal level during the first portion, wherein the periodic signal has a second signal level during the second portion, and wherein the periodic signal has a third signal level during the third portion, and wherein the first and third portions are separated by part of the second portion having the second signal level different than the first and third signal levels, wherein the periodic signal is a periodic differential signal and the periodic differential signal has a waveform that represents a sine wave, wherein the sine wave has a fundamental frequency, and wherein the periodic differential signal has substantially no third harmonic component.

14. The circuit of claim 13, wherein the periodic differential signal is a first periodic differential signal, and wherein the signal generator comprises:
a first differential divider that frequency divides a periodic signal by a first value and thereby generates first signals;
a second differential divider that frequency divides some of the first signals and thereby generates second signals;
logic gates that receive the first signals and the second signals and that output a second periodic differential signal; and
a retiming circuit that receives the second periodic differential signal and outputs the first periodic differential signal.

15. The circuit of claim 14, wherein the periodic signal that the first differential divider divides is generated by a Phase-Locked Loop (PLL).

16. The circuit of claim 13, wherein the periodic differential signal is a first periodic differential signal, wherein the signal generator also supplies a second periodic differential signal to the mixer, and wherein the first and second periodic differential signals have substantially identical waveforms except that the second periodic differential signal is phase-shifted with respect to the first periodic signal by substantially ninety degrees.

17. The circuit of claim 13, wherein the first signal level is a positive voltage, wherein the second signal level is a voltage of substantially zero volts, and wherein the third signal level is a negative voltage.

18. The circuit of claim 13, wherein the first signal level is a positive current, wherein the second signal level is a current of substantially zero amperes, and wherein the third signal level is a negative current.

19. The circuit of claim 13, wherein the circuit is a wireless transmitter that transmits signals in accordance with one of a Global System for Mobile (GSM) communications standard and an Enhanced Data rates for GSM Evolution (EDGE) communication standard.

20. An integrated circuit comprising:
a mixer; and
means for supplying a periodic differential signal to the mixer, wherein a period of the periodic differential signal includes a first portion, a second portion and a third portion, wherein the periodic differential signal has a first signal level during the first portion, wherein the periodic differential signal has a second signal level during the second portion, and wherein the periodic differential signal has a third signal level during the third portion, and wherein the first and third portions are separated by part of the second portion having the second signal level different than the first and third signal levels, wherein the periodic signal is a periodic differential signal and the periodic differential signal has a waveform that represents a sine wave, wherein the sine wave has a fundamental frequency, and wherein the periodic differential signal has substantially no third harmonic component.

21. The integrated circuit of claim 20, further comprising:
a Phase-Locked Loop (PLL) that supplies a periodic signal to the means.

22. The integrated circuit of claim 20, wherein the mixer is a part of a transmit chain of a wireless transmitter.

* * * * *